United States Patent
Maruyama et al.

(10) Patent No.: US 6,825,118 B2
(45) Date of Patent: Nov. 30, 2004

(54) METHOD OF MANUFACTURING SEMICONDUCTOR DEVICE HAVING TRENCH ELEMENT-ISOLATING STRUCTURE

(75) Inventors: Takahiro Maruyama, Tokyo (JP); Ryoichi Yoshifuku, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/438,980

(22) Filed: May 16, 2003

(65) Prior Publication Data

US 2004/0097046 A1 May 20, 2004

(30) Foreign Application Priority Data

Nov. 19, 2002 (JP) ........................................ 2002-335763

(51) Int. Cl.$^7$ ...................... H01L 21/302; H01L 21/461
(52) U.S. Cl. ........................ 438/692; 438/706; 438/745
(58) Field of Search ................................ 438/692, 706, 438/745, 269, 294, 295, 296, 297, 481, 412, 430, 439, 442, 524, 637, 638, 645, 647, 649, 657, 660, 689, 700, 704, 721, 755

(56) References Cited

U.S. PATENT DOCUMENTS

| | | | | | |
|---|---|---|---|---|---|
| 4,471,525 A | * | 9/1984 | Sasaki | ........................ | 29/576 |
| 4,656,497 A | * | 4/1987 | Rogers et al. | ................ | 357/50 |
| 5,059,550 A | * | 10/1991 | Tateoka et al. | ............. | 438/680 |
| 5,373,180 A | * | 12/1994 | Hillenius et al. | ........... | 257/357 |
| 6,265,743 B1 | * | 7/2001 | Sakai et al. | ................. | 257/305 |
| 6,503,799 B2 | * | 1/2003 | Horita et al. | ............... | 438/269 |

FOREIGN PATENT DOCUMENTS

| | | |
|---|---|---|
| JP | 10-340950 | 12/1998 |
| JP | 2000-232155 | 8/2000 |

* cited by examiner

Primary Examiner—David Nhu
(74) Attorney, Agent, or Firm—Leydig, Voit & Mayer, Ltd.

(57) ABSTRACT

A laminated film including a thermal oxide film, a polysilicon film and a silicon nitride film is formed on a silicon substrate, and the laminated film is patterned by using a resist pattern as a mask. An element-isolating trench is formed in the silicon substrate by using a patterned laminated film as a mask, and a silicon oxide film is buried in the element-isolating trench. After removing the silicon nitride film, unnecessary portions of the silicon oxide film are removed by CMP by using the polysilicon film as a stopper film. Then, the polysilicon film and the thermal oxide film are removed.

8 Claims, 5 Drawing Sheets

METHOD OF MANUFACTURING SEMICONDUCTOR DEVICE HAVING TRENCH ELEMENT-ISOLATING STRUCTURE

BACKGROUND OF THE INVENTION

1. Field of the Invention

The present invention relates to a method of manufacturing a semiconductor device, and more particularly to a method of manufacturing a trench element-isolating structure.

2. Description of the Background Art

Heretofore, in a semiconductor integrated circuit, elements are isolated for eliminating electrical interference between the elements during operation, and for independently controlling each element. In particular, a trench element-isolating structure is an essential structure for miniaturization of circuits.

It has been known that various problems arise if a silicon oxide film buried in a trench (hereafter referred to as "buried oxide film") is depressed from a surface of a substrate, and an indentation is formed, as disclosed in Japanese Patent Laid-Open No. H10-340950 (FIG. 13).

Even if the indentation is not formed, a large protrusion of the buried oxide film may result in dimensional variation in gate forming, or etching residues. Therefore, it is an important problem in determining the performance of an element to control the extent of protrusion of the buried oxide film from the surface of the substrate when a trench element-isolation structure is formed.

In order to make prevention of formation of indentation and the reduction of the extent of protrusion of the buried oxide film compatible, it is important to minimize variation of the extent of protrusion of the buried oxide film.

However, in conventional manufacturing methods, it was difficult to reduce the variation of the quantity of protrusion of the buried oxide film.

SUMMARY OF THE INVENTION

The present invention has been conceived to solve the previously-mentioned problems and a general object of the present invention is to provide a novel and useful method of manufacturing a semiconductor device.

A more specific object of the present invention is to reduce the variation of the quantity of protrusion of the buried oxide film.

The above object of the present invention is attained by a following method of manufacturing a semiconductor device.

According to a first aspect of the present invention, in the method, a laminated film including a thermal oxide film, a non-single-crystal silicon film and a silicon nitride film is formed on a substrate. The laminated film is patterned. An element-isolating trench is formed in the substrate, using the patterned laminated film as a mask. A buried oxide film is deposited in the element-isolating trench. After depositing the buried oxide film, the silicon nitride film is removed. Unnecessary portions of the buried oxide film are removed by chemical-mechanical polishing (CMP) using the non-single-crystal silicon film as a stopper film. The non-single-crystal silicon film and the thermal oxide film are removed.

According to a second aspect of the present invention, in the method, a laminated film including a thermal oxide film, a silicon nitride film, and an oxide film or a metal film is formed on a substrate. The laminated film is patterned. An element-isolating trench is formed in the substrate by using a patterned laminated film as a mask. After forming the element-isolating trench, the oxide film or the metal film is removed. A buried oxide film is buried in the element-isolating trench. Unnecessary portions of the buried oxide film are removed by CMP using the silicon nitride film as a stopper film. The silicon nitride film and the thermal oxide film are removed.

According to a third aspect of the present invention, in the method, a laminated film including a thermal oxide film, a non-single-crystal silicon film, and an oxide film or a metal film is formed on a substrate. The laminated film is patterned. An element-isolating trench is formed in the substrate using a patterned laminated film as a mask. After forming the element-isolating trench, the oxide film or the metal film is removed. After removing the oxide film or the metal film, a buried oxide film is buried in the element-isolating trench. Unnecessary portions of the buried oxide film are removed by CMP using the non-single-crystal silicon film as a stopper film. The non-single-crystal silicon film and the thermal oxide film are removed.

Other objects and further features of the present invention will be apparent from the following detailed description when read in conjunction with the accompanying drawings.

DETAILED DESCRIPTION OF THE PREFERRED EMBODIMENTS

Figure 1:
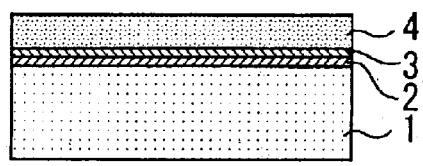
FIGS. 1A to 1I are sectional views for illustrating a method of manufacturing a semiconductor device according to a first embodiment of the present invention.
Figure 1:
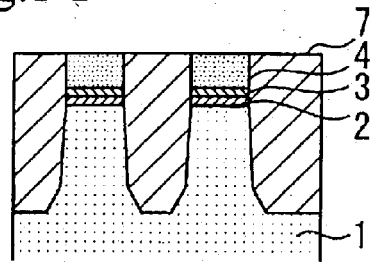
Figure 1:
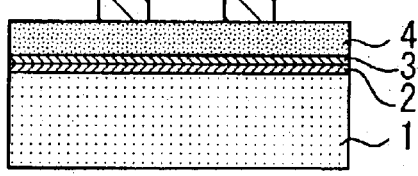
Figure 1:
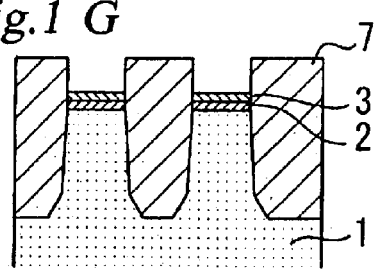
Figure 1:
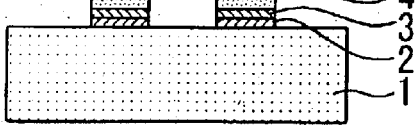
Figure 1:
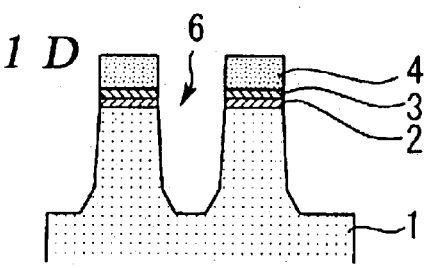
Figure 1:
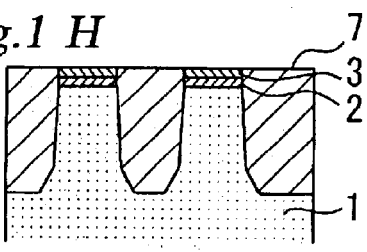
Figure 1:
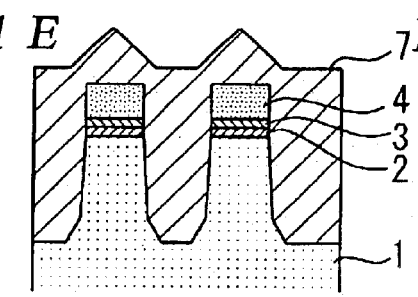
Figure 1:
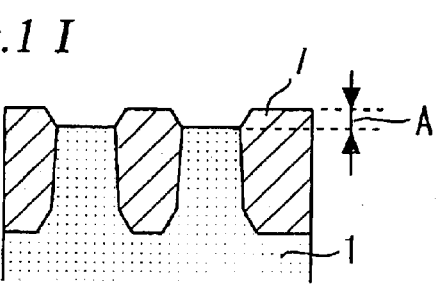

In the following, principles and embodiments of the present invention will be described with reference to the accompanying drawings. The members and steps that are common to some of the drawings are given the same reference numerals and redundant descriptions therefore may be omitted.

First Embodiment

FIGS. 1A to 1I are sectional views for illustrating a method of manufacturing a semiconductor device according to a first embodiment of the present invention.

First, as shown in FIG. 1A, a thermal oxide film 2 having a thickness of 2 nm to 30 nm is formed on a silicon substrate, which is a substrate 1. Next, a polysilicon film, which is a non-single-crystal silicon film 3 having a thickness of 10 nm to 70 nm is formed on the thermal oxide film 2. Furthermore, a silicon nitride film 4 having a thickness of at least 100 nm is formed on the polysilicon film 3.

Next, as shown in FIG. 1B, a resist pattern 5 is formed by using a lithography process so as to cover the silicon nitride film 4 formed above an active region (i.e., a region other than a region wherein an element-isolating trench 6 is formed).

Then, as shown in FIG. 1C, the silicon nitride film 4, the polysilicon film 3, and the thermal oxide film 2 are patterned by dry etching using the resist pattern 5 as a mask. By this dry etching, the silicon nitride film 4, the polysilicon film 3, and the thermal oxide film 2 on the element-isolating region are removed. Thereafter, the resist pattern 5 is removed.

Next, as shown in FIG. 1D, an element-isolating trench 6 is formed in the silicon substrate 1 by dry etching using the patterned silicon nitride film 4, polysilicon film 3 and thermal oxide film 2 as a mask.

Next, as shown in FIG. 1E, a silicon oxide film, which is a buried oxide film 7, is deposited in the element-isolating trench 6 and on the silicon nitride film 4 by an HDP-CVD method.

Then, planarization is performed by CMP using the silicon nitride film 4 as a stopper film to form a structure wherein the silicon oxide film 7 is buried only in the element-isolating trench 6 as shown in FIG. 1F. That is, unnecessary portions of the silicon oxide film 7 are removed by the planarization.

Next, as shown in FIG. 1G, the silicon nitride film 4 is removed by wet etching using hot phosphoric acid.

Then, as shown in FIG. 1H, planarization is performed by CMP using the polysilicon film 3 as a stopper film. In this planarization, by using $CeO_2$ slurry or the like, the buried oxide film 7 is polished in the condition of a sufficiently high selectivity to the polysilicon film 3. Since a polishing quantity of the silicon oxide film 7 is small, a variation of a polishing quantity of the polysilicon film 3 is sufficiently small.

Finally, as shown in FIG. 1I, the polysilicon film 3 is removed by wet etching using an $NH_4OH$ solution, and the thermal oxide film 2 is further removed by wet etching using hydrofluoric acid. Thereby, a desired element-isolating structure can be obtained.

In the first embodiment, as described above, after the silicon nitride film 4, which is an uppermost layer of the mask in the formation of the element-isolating trench 6, has been removed, the buried oxide film 7 is planarized by using the polysilicon film 3 as the stopper film. After planarization, the polysilicon film 3 and the thermal oxide film 2 are sequentially removed.

Thus, a protruding quantity A of the buried oxide film 7 onto a surface of the substrate 1 (refer to FIG. 1I) is not determined by a thickness of the silicon nitride film 4 having a large variation, but is determined by a thickness of the polysilicon film 3 and the thermal oxide film 2 in film formation having a small variation.

Therefore, the variation of the protruding quantity A of the silicon oxide film 7 can be reduced as compared with conventional methods. Thereby, a satisfactory element-isolating shape without any excessive protrusion can be obtained, and a reliability of the semiconductor device can be improved.

Although a polysilicon film is formed as a non-single-crystal silicon film 3 in the first embodiment, an amorphous silicon film may also be formed. (This applies to second to fifth embodiments described later.)

Second Embodiment

FIGS. 2A to 2J are sectional views for illustrating a method of manufacturing a semiconductor device according to a second embodiment of the present invention.

Figure 2:
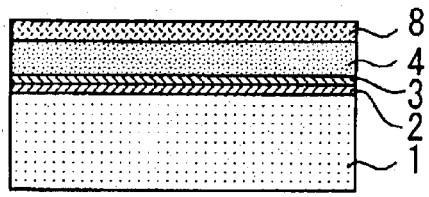
FIGS. 2A to 2J are sectional views for illustrating a method of manufacturing a semiconductor device according to a second embodiment of the present invention.
Figure 2:
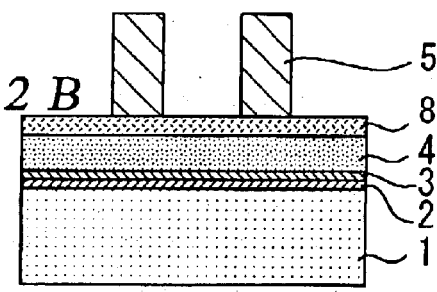
Figure 2:
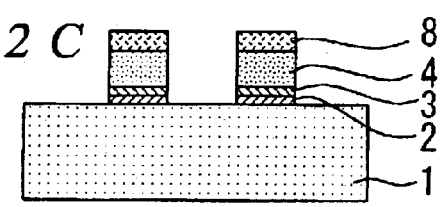
Figure 2:
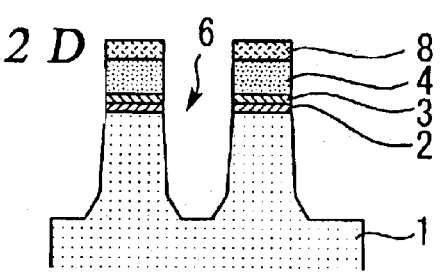
Figure 2:
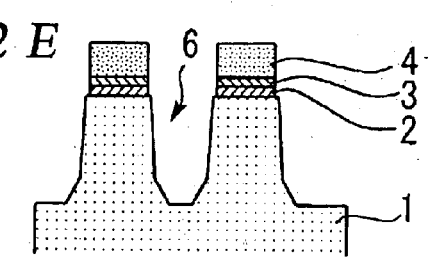
Figure 2:
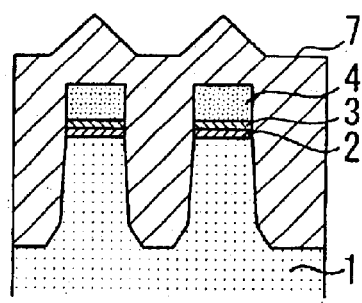
Figure 2:
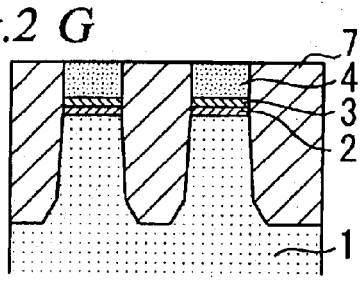
Figure 2:
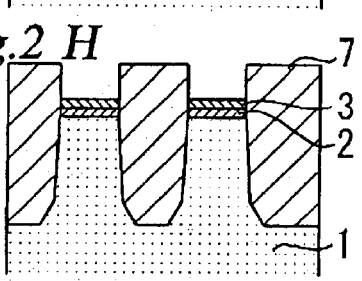
Figure 2:
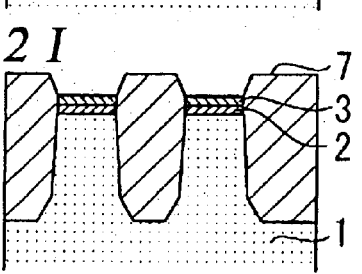
Figure 2:
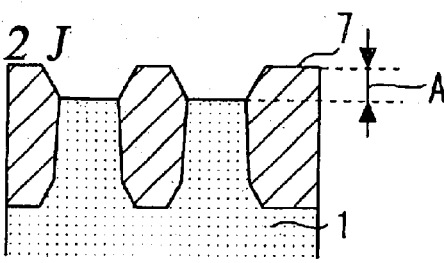

First, as shown in FIG. 2A, a thermal oxide film 2, a polysilicon film 3, and a silicon nitride film 4 are laminated on a silicon substrate 1 in the same manner as in the first embodiment (refer to FIG. 1A). Furthermore, a TEOS oxide film 8 is formed as an oxide film on the silicon nitride film 4.

Next, as shown in FIG. 2B, a resist pattern 5 is formed by using a lithography process so as to cover the TEOS oxide film 8 above an active region.

Then, as shown in FIG. 2C, the TEOS oxide film 8, the silicon nitride film 4, the polysilicon film 3, and the thermal oxide film 2 are patterned by dry etching by using the resist pattern 5 as a mask. Thereafter, the resist pattern 5 is removed.

Next, as shown in FIG. 2D, an element-isolating trench 6 is formed in the silicon substrate by dry etching using the patterned TEOS oxide film 8, silicon nitride film 4, polysilicon film 3 and thermal oxide film 2 as a mask.

Next, as shown in FIG. 2E, the TEOS oxide film 8 is selectively removed by wet etching using hydrofluoric acid. Thereby, a surface of the silicon nitride film 4 is exposed. The surface of the silicon nitride film 4 has not been exposed in dry etching to form the element-isolating trench 6. Since the wet etching of the TEOS oxide film 8 is performed in the condition having a high selectivity to the underlying silicon nitride film 4, a polishing quantity of the silicon nitride film 4 due to wet etching is sufficiently small. Therefore, the variation of the thickness of the silicon nitride film 4 after the wet etching is only the variation when the silicon nitride film 4 is formed, and is sufficiently small.

Then, as shown in FIG. 2F, a silicon oxide film 7 is deposited in the element-isolating trench 6 and on the silicon nitride film 4 by an HDP-CVD method.

Then, planarization is performed by CMP using the silicon nitride film 4 as a stopper film to form a structure wherein the silicon oxide film 7 is buried only in the element-isolating trench 6 as shown in FIG. 2G.

Next, as shown in FIG. 2H, the silicon nitride film 4 is removed by wet etching using hot phosphoric acid.

Then, as shown in FIG. 2I, a desired thickness of the silicon oxide film 7 is removed by wet etching using hydrofluoric acid (partial etching).

Finally, as shown in FIG. 2J, the polysilicon film 3 is removed by wet etching using an $NH_4OH$ solution, and the thermal oxide film 2 is further removed by wet etching using hydrofluoric acid. Thereby, a desired element-isolating structure can be obtained.

In the second embodiment, as described above, after the element-isolating trench 6 has been formed, the TEOS oxide film 8 is removed to expose the silicon nitride film 4; and the silicon oxide film 7 is planarized by using the silicon nitride film 4 as a stopper mask.

Therefore, since the silicon nitride film 4 covered with the TEOS oxide film 8 is not etched when the element-isolating trench 6 is formed, i.e., in dry etching, the variation of the thickness of the silicon nitride film 4 is only the variation when the silicon nitride film 4 is formed, and is sufficiently small. Thus, a protruding quantity A of the buried oxide film 7 (refer to FIG. 2J) is determined by the thickness of the polysilicon film 3 and the thermal oxide film 2 in film formation having a small variation.

Therefore, the variation of the protruding quantity A of the silicon oxide film 7 can be reduced as compared with conventional methods. Thereby, satisfactory element-isolating shape without any excessive protrusion can be obtained, and the reliability of the semiconductor device can be improved.

In addition, after the silicon nitride film 4 has been removed, the protruding quantity A of the silicon oxide film 7 can be controlled to a desired quantity by the partial etching of the silicon oxide film 7. Here, the partial etching is an optional process step, which can be decided by considering the thickness of the silicon nitride film 4 or the like. (This applies also to a third embodiment described later.)

In the second embodiment, although the TEOS oxide film is formed as the oxide film 8 on the silicon nitride film 4, an aluminum oxide ($Al_2O_3$) film or a titanium oxide ($TiO_2$) film may also be formed in place of the TEOS oxide film 8. In these cases also, the same effect as the effect of the second embodiment can be obtained. (This applies also to a fourth embodiment described later.) The polysilicon film 3 is not necessarily formed between the thermal oxide film 2 and the silicon nitride film 4. (This applies also to the third embodiment described later.)

Third Embodiment

FIGS. 3A to 3J are sectional views for illustrating a method of manufacturing a semiconductor device according to a third embodiment of the present invention.

Figure 3:
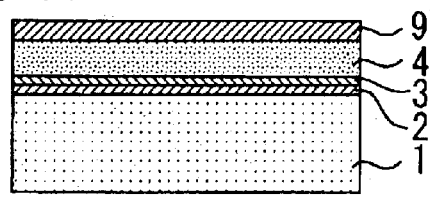
FIGS. 3A to 3J are sectional views for illustrating a method of manufacturing a semiconductor device according to a third embodiment of the present invention.
Figure 3:
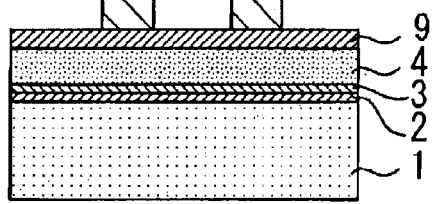
Figure 3:
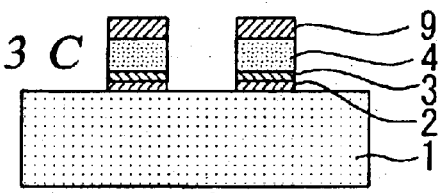
Figure 3:
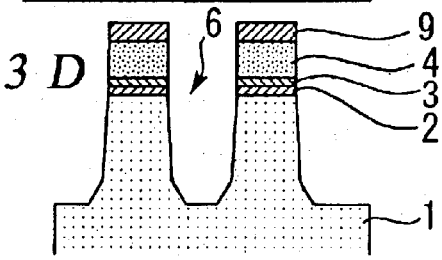
Figure 3:
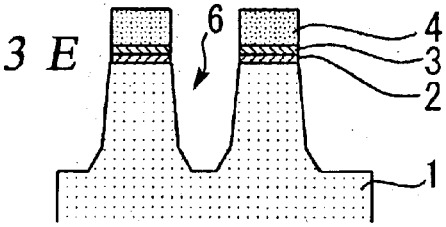
Figure 3:
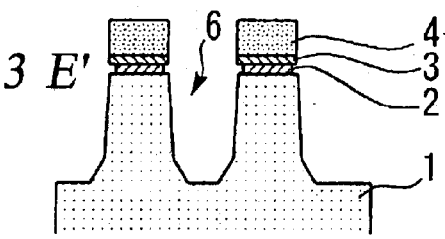
Figure 3:
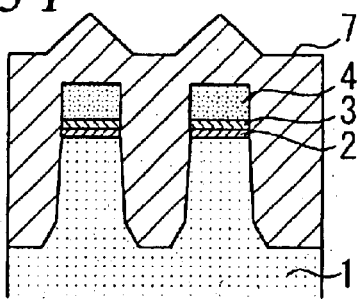
Figure 3:
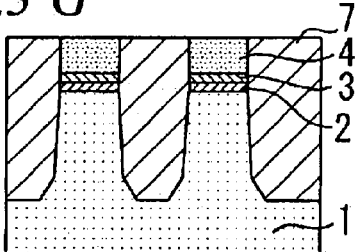
Figure 3:
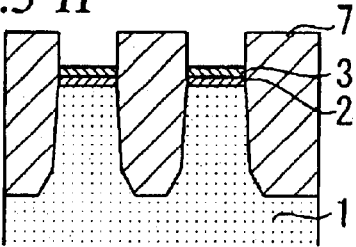
Figure 3:
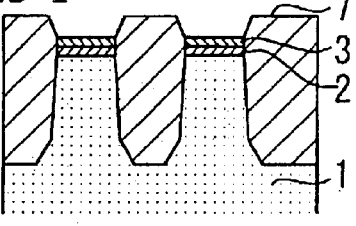
Figure 3:
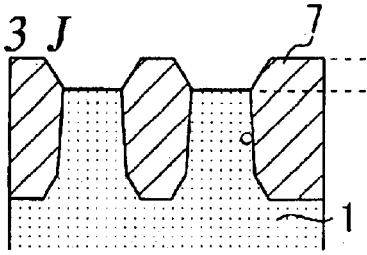

First, as shown in FIG. 3A, a thermal oxide film 2, a polysilicon film 3, and a silicon nitride film 4 are laminated on a silicon substrate 1 in the same manner as in the first embodiment (refer to FIG. 1A). Furthermore, a ruthenium (Ru) film 9 is formed as a metal film on the silicon nitride film 4.

Next, as shown in FIG. 3B, a resist pattern 5 is formed by using a lithography process so as to cover the Ru film 9 above an active region.

Then, as shown in FIG. 3C, the Ru film 9, the silicon nitride film 4, the polysilicon film 3, and the thermal oxide film 2 are patterned by dry etching using the resist pattern 5 as a mask. Then, the resist pattern 5 is removed.

Next, as shown in FIG. 3D, an element-isolating trench 6 is formed in the silicon substrate 1 by dry etching using the patterned Ru film 9, silicon nitride film 4, polysilicon film 3 and thermal oxide film 2 as a mask.

Next, as shown in FIG. 3E, the Ru film 9 is selectively removed by dry etching using plasma of the mixed gas of oxygen and nitrogen. Here, if the Ru film 9 is removed by wet etching using hydrofluoric acid, side etching occurs in the thermal oxide film 2 as shown in FIG. 3E'. However, since the Ru film 9 is removed by dry etching as described above, the occurrence of such a problem can be prevented.

Next, as shown in FIG. 3F, a silicon oxide film 7 is deposited in the element-isolating trench 6 and on the silicon nitride film 4 by an HDP-CVD method.

Then, planarization is performed by CMP using the silicon nitride film 4 as a stopper film to form a structure wherein the silicon oxide film 7 is buried only in the element-isolating trench 6 as shown in FIG. 3G.

Next, as shown in FIG. 3H, the silicon nitride film 4 is removed by wet etching using hot phosphoric acid.

Then, as shown in FIG. 3I, a desired thickness of the silicon oxide film 7 is removed by wet etching using hydrofluoric acid (partial etching).

Finally, as shown in FIG. 3J, the polysilicon film 3 is removed by wet etching using an $NH_4OH$ solution, and the thermal oxide film 2 is removed by wet etching using hydrofluoric acid. Thereby, a desired element-isolating structure can be obtained.

In the third embodiment, as described above, the Ru film 9 is formed in place of the TEOS oxide film 8 in the second embodiment. Therefore, the same effect as in the second embodiment can be obtained by the third embodiment.

In the third embodiment, although plasma of the mixed gas of oxygen and nitrogen is used for the dry etching of the Ru film 9, the present invention is not limited thereto, but plasma of the mixed gas of oxygen and chlorine, plasma of $CF_4$ gas, or plasma of $CHF_3$ gas can also be used. (This applies to a fifth embodiment described later.)

Fourth Embodiment

FIGS. 4A to 4I are sectional views for illustrating a method of manufacturing a semiconductor device according to a fourth embodiment of the present invention.

Figure 4:
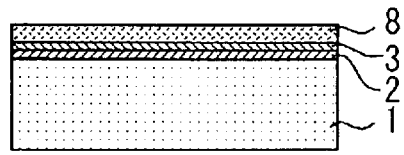
FIGS. 4A to 4I are sectional views for illustrating a method of manufacturing a semiconductor device according to a fourth embodiment of the present invention.
Figure 4:
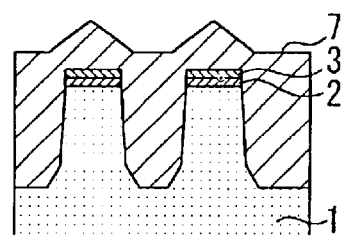
Figure 4:
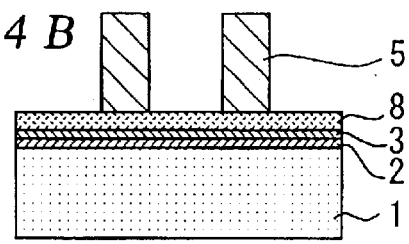
Figure 4:
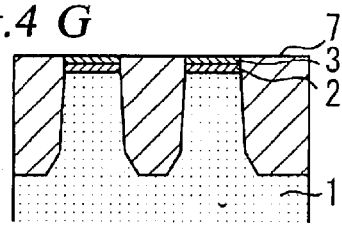
Figure 4:
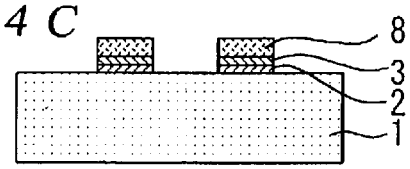
Figure 4:
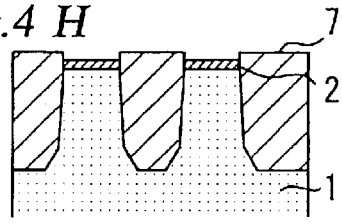
Figure 4:
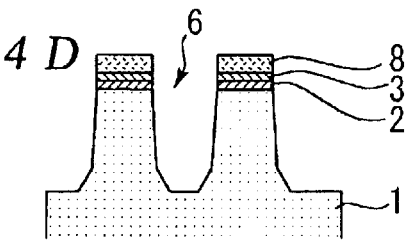
Figure 4:
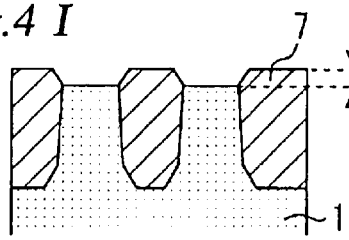
Figure 4:
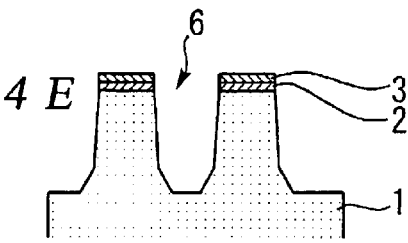

First, as shown in FIG. 4A, a thermal oxide film 2 and a poly silicon film 3 are laminated on a silicon substrate 1, and a TEOS oxide film 8 is formed on the polysilicon film 3.

Next, as shown in FIG. 4B, a resist pattern 5 is formed by using a lithography process so as to cover the TEOS oxide film 8 above an active region.

Then, as shown in FIG. 4C, the TEOS oxide film 8, the polysilicon film 3, and the thermal oxide film 2 are patterned by dry etching using the resist pattern 5 as a mask. Then, the resist pattern 5 is removed.

Next, as shown in FIG. 4D, an element-isolating trench 6 is formed in the silicon substrate 1 by dry etching using the patterned TEOS oxide film 8, polysilicon film 3 and thermal oxide film 2 as a mask.

Next, as shown in FIG. 4E, the TEOS oxide film 8 is selectively removed by wet etching using hydrofluoric acid. Thereby, a surface of the polysilicon film 3 is exposed. The surface of the polysilicon film 3 has not been exposed in dry etching for forming the element-isolating trench 6. Since the wet etching of the TEOS oxide film 8 is performed under the condition having a high selectivity to the underlying polysilicon film 3, a quantity loss of the polysilicon film 3 due to the wet etching is sufficiently small. Therefore, the variation of the thickness of the polysilicon film 3 after the wet etching is only the variation when the polysilicon film 3 is formed, and is sufficiently small.

Then, as shown in FIG. 4F, a silicon oxide film 7 is deposited in the element-isolating trench 6 and on the polysilicon film 3 by an HDP-CVD method.

Then, planarization is performed by CMP using the polysilicon film 3 as a stopper film to form a structure wherein the silicon oxide film 7 is buried only in the element-isolating trench 6 as shown in FIG. 4G.

Next, as shown in FIG. 4H, the polysilicon film 3 is removed by wet etching using an aqueous solution of $NH_4OH$.

Finally, as shown in FIG. 4I, the thermal oxide film 2 is removed by wet etching using hydrofluoric acid. Thereby, a desired element-isolating structure can be obtained.

In the fourth embodiment, as described above, after the element-isolating trench 6 has been formed, the TEOS oxide film 8 is removed to expose the polysilicon film 3; and the silicon oxide film 7 is planarized by using the polysilicon film 3 as a stopper film.

Therefore, since the polysilicon film 3 covered with the TEOS oxide film 8 is not etched when the element-isolating trench 6 is formed, i.e., in dry etching, the variation of the thickness of the polysilicon film 3 is only the variation when the polysilicon film 3 is formed, and is sufficiently small. Thus, a protruding quantity A of the silicon oxide film 7 (refer to FIG. 4I) is determined by the thickness of the polysilicon film 3 and the thermal oxide film 2 in film formation having a small variation.

Therefore, the variation of the protruding quantity A of the silicon oxide film 7 can be reduced compared with conventional methods. Thereby, satisfactory element-isolating shape without any excessive protrusion can be obtained, and the reliability of the semiconductor device can be improved.

In the fourth embodiment, since the silicon nitride film 4 in the second embodiment is not formed, the number of process steps can be reduced, thus reducing the manufacturing costs. In addition, the variation of the protruding quantity A of the silicon oxide film 7 can further be reduced as compared with the second embodiment.

Fifth Embodiment

FIGS. 5A to 5I are sectional views for illustrating a method of manufacturing a semiconductor device according to a fifth embodiment of the present invention.

Figure 5:
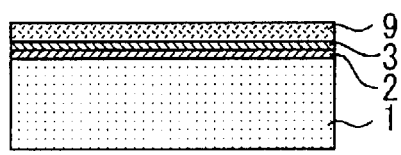
FIGS. 5A to 5I are sectional views for illustrating a method of manufacturing a semiconductor device according to a fifth embodiment of the present invention.
Figure 5:
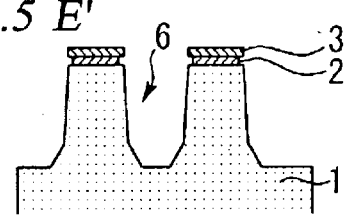
Figure 5:
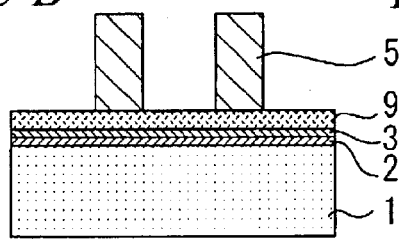
Figure 5:
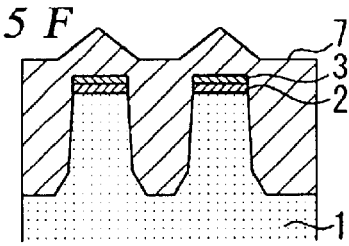
Figure 5:
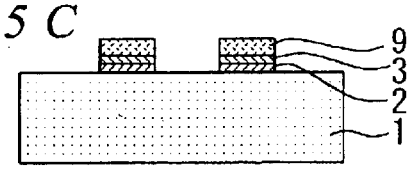
Figure 5:
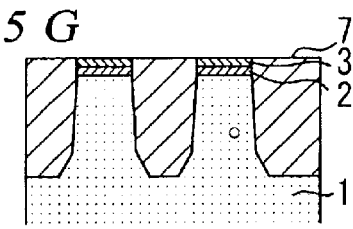
Figure 5:
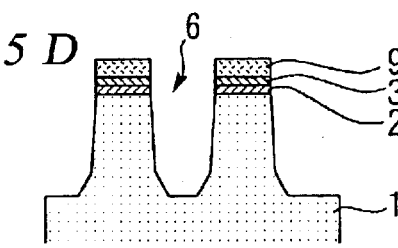
Figure 5:
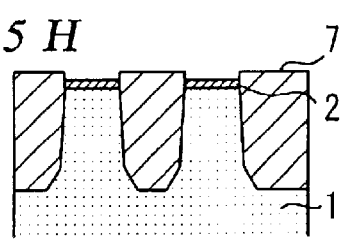
Figure 5:
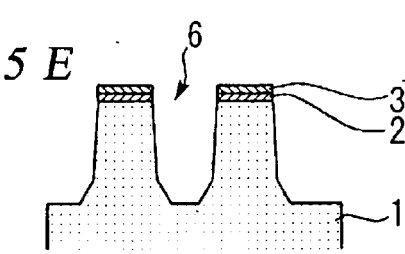
Figure 5:
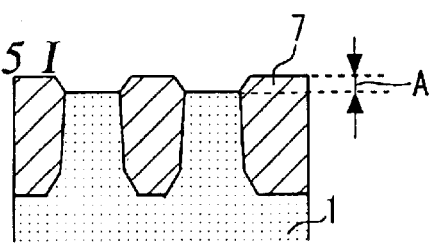

First, as shown in FIG. 5A, a thermal oxide film 2 and a polysilicon film 3 are laminated on a silicon substrate 1, and a Ru film 9 is further formed on the polysilicon film 3.

Next, as shown in FIG. 5B, a resist pattern 5 is formed by using a lithography process so as to cover the Ru film 9 above an active region.

Then, as shown in FIG. 5C, the Ru film 9, the polysilicon film 3, and the thermal oxide film 2 are patterned by dry etching using the resist pattern 5. Thereafter, the resist pattern 5 is removed.

Next, as shown in FIG. 5D, an element-isolating trench 6 is formed in the silicon substrate 1 by dry etching using the patterned Ru film 9, polysilicon film 3 and thermal oxide film 2 as a mask.

Next, as shown in FIG. 5E, the Ru film 9 is selectively removed by dry etching using plasma of the mixed gas of oxygen and nitrogen. Here, if the Ru film 9 is a removed by wet etching using hydrofluoric acid, side etching occurs in the thermal oxide film 2 as shown in FIG. 5E'. However, since the Ru film 9 is removed by dry etching as described above, the occurrence of such a problem can be prevented.

Next, as shown in FIG. 5F, a silicon oxide film 7 is deposited in the element-isolating trench 6 and on the polysilicon film 3 by an HDP-CVD method.

Then, planarization is performed by CMP using the polysilicon film 3 as a stopper film to form a structure wherein the silicon oxide film 7 is buried only in the element-isolating trench 6 as shown in FIG. 5G.

Next, as shown in FIG. 5H, the polysilicon film 3 is removed by wet etching using an aqueous solution of NH$_4$OH.

Then, as shown in FIG. 5I, the thermal oxide film 2 is removed by wet etching using hydrofluoric acid. Thereby, a desired element-isolating structure can be obtained.

In the fifth embodiment, as described above, the Ru film 9 is formed in place of the TEOS oxide film 8 in the fourth embodiment therefore, the same effect as in the fourth embodiment can be obtained by the fifth embodiment.

This invention, when practiced illustratively in the manner described above provides the following major effects:

According to the present invention, in the formation of a trench-type element-isolating structure, the variation of the protruding quantity of the buried oxide film can be reduced.

Further, the present invention is not limited to these embodiments, but variations and modifications may be made without departing from the scope of the present invention.

The entire disclosure of Japanese Patent Application No. 2002-335763 filed on Nov. 19, 2002 containing specification, claims, drawings and summary are incorporated herein by reference in its entirety.

What is claimed is:

1. A method of manufacturing a semiconductor device, comprising:

forming a laminated film including a thermal oxide film, a non-single-crystal silicon film, and a silicon nitride film on a substrate;

patterning the laminated film;

forming an element-isolating trench in the substrate using the laminated film, after patterning, as a mask;

depositing a buried oxide film in the element-isolating trench;

after depositing the buried oxide film, removing portions of the buried oxide film by chemical-mechanical polishing, thereby exposing the silicon nitride film;

removing, after exposing, the silicon nitride film;

after removing the silicon nitride film, removing portions of the buried oxide film by chemical-mechanical polishing, using the non-single-crystal silicon film as a stopper film; and removing the non-single-crystal silicon film and the thermal oxide film.

2. A method of manufacturing a semiconductor device, comprising:

forming on a substrate a laminated film including, sequentially, a thermal oxide film, a silicon nitride film, and a protection film, protecting the silicon nitride film, on the silicon nitride film;

patterning the laminated film;

forming an element-isolating trench in the substrate using the laminated film, after patterning, as a mask;

removing, after forming the element-isolating trench, the protection film, exposing the silicon nitride film;

depositing, after removing the protection film, a buried oxide film in the element-isolating trench;

removing portions of the buried oxide film by chemical-mechanical polishing, using the silicon nitride film as a stopper film; and removing the silicon nitride film and the thermal oxide film.

3. The method of manufacturing a semiconductor device according to claim 2, wherein the laminated film further includes a non-single-crystal silicon film between the thermal oxide film and the silicon nitride film, and, after removing portions of the buried oxide film, removing the silicon nitride film, the non-single-crystal silicon film, and the thermal oxide film.

4. A method of manufacturing a semiconductor device, comprising:

forming on a substrate, a laminated film including, sequentially, a thermal oxide film, a non-single-crystal silicon film, and a protection film protecting the non-single-crystal silicon film, on the non-single-crystal silicon film;

patterning the laminated film;

forming an element-isolating trench in the substrate using the laminated film, after patterning, as a mask;

removing, after forming the element-isolating trench, the protection film, exposing the non-single-crystal silicon film;

depositing, after removing the protection film, a buried oxide film in the element-isolating trench;

removing portions of the buried oxide film by chemical-mechanical polishing, using the non-single-crystal silicon film as a stopper film; and removing the non-single-crystal silicon film and the thermal oxide film.

5. The method of manufacturing a semiconductor device according to claim 2, wherein the protection film is an oxide film selected from the group consisting of a TEOS oxide film, an aluminum oxide film, and a titanium oxide film.

6. The method of manufacturing a semiconductor device according to claim 4, wherein the protection film is an oxide film selected from the group consisting of a TEOS oxide film, an aluminum oxide film, and a titanium oxide film.

7. The method of manufacturing a semiconductor device according to claim 2, wherein the protection film is a ruthenium film.

8. The method of manufacturing a semiconductor device according to claim 4, wherein the protection film is a ruthenium film.

* * * * *